Figure 1:
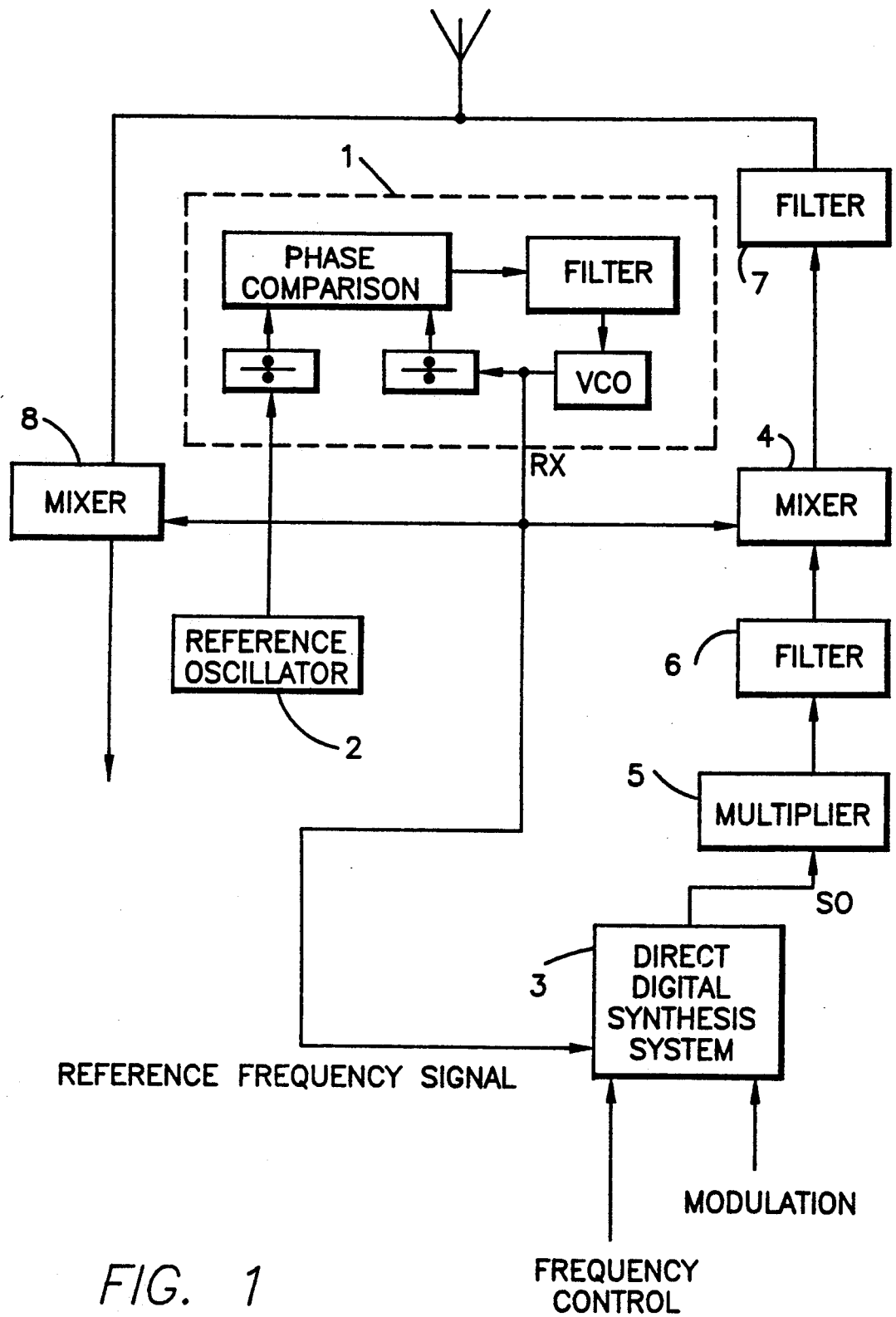

United States Patent [19]

Heinonen

[11] Patent Number: 5,301,367

[45] Date of Patent: Apr. 5, 1994

[54] DIRECT DIGITAL SYNTHESIZER FOR PRODUCING A MODULATED INTERMEDIATE FREQUENCY IN A RADIO APPARATUS

[75] Inventor: Jarmo J. Heinonen, Salo, Finland

[73] Assignee: Nokia Mobile Phones Ltd., Salo, Finland

[21] Appl. No.: 934,927

[22] Filed: Aug. 25, 1992

[30] Foreign Application Priority Data

Sep. 4, 1991 [FI] Finland ............................ 914181

[51] Int. Cl.$^5$ ............................................. H04B 1/40
[52] U.S. Cl. ......................................... 455/76; 455/86
[58] Field of Search ............... 455/76, 86, 113, 119, 455/73, 112; 332/127, 117, 144, 100, 103; 331/23; 375/7

[56] References Cited

U.S. PATENT DOCUMENTS

| | | | |
|---|---|---|---|
| 4,449,250 | 5/1984 | Kurby | 455/76 |
| 4,792,939 | 12/1988 | Hikita et al. | 370/24 |
| 4,878,035 | 10/1989 | Vendely et al. | 332/101 |
| 5,008,900 | 4/1991 | Critchlow et al. | 375/8 |
| 5,010,585 | 4/1991 | Garcia | 455/118 |
| 5,045,817 | 9/1991 | Sheffer | 332/117 |
| 5,111,162 | 5/1992 | Hietala et al. | 455/76 |

FOREIGN PATENT DOCUMENTS

| | | |
|---|---|---|
| 92307770.5 | 6/1993 | European Pat. Off. . |
| 4025771A1 | 2/1991 | Fed. Rep. of Germany .......... H04B 1/40 |
| 0127209 | 10/1979 | Japan .................................... 455/76 |
| WO91/07828 | 5/1991 | PCT Int'l Appl. ............. H04B 1/38 |

Primary Examiner—Reinhard J. Eisenzopf
Assistant Examiner—Nguyen Vo
Attorney, Agent, or Firm—Perman & Green

[57] ABSTRACT

A synthesizer for a radio transceiver uses a Direct Digital Synthesis (DDS) system (3) to provide a modulated signal for the transmitter section. The modulated signal (So) is then mixed in a mixer (4) using a signal from a local oscillator (1) to provide the signal for transmission. The reference frequency for the DDS system is provided by the local oscillator (1) of the receiver section. The local oscillator is used to provide the signal for the mixer (4).

4 Claims, 1 Drawing Sheet

DIRECT DIGITAL SYNTHESIZER FOR PRODUCING A MODULATED INTERMEDIATE FREQUENCY IN A RADIO APPARATUS

The invention relates to a general-purpose synthesizer for use in the radio frequency (RF) sections i.e. the RF transmitter and receiver sections, of a radio apparatus, in particular a radiotelephone.

Radio frequency sections in general use differ, inter alia, regarding the means of modulation and the frequencies they use. Examples of the type of Modulation used are, Frequency Modulation (FM), Quadrature Phase Shift Keying (QPSK) and Gaussian Minimum Shift Keying (GMSK).

In the case of FM modulation, the modulation has been accomplished using a Phase-Locked Loop (PLL) synthesizer to generate a modulated transmitter frequency or to generate a modulated intermediate frequency.

In digital modulation systems the modulation is generated using e.g. an analog In-Phase/Quadrature (I/Q) modulator.

Generating FM modulation in a PLL synthesizer creates two conflicting goals. That is, that, on the one hand the cut-off frequency of the phase locked loop needs to be high enough in order to have a sufficiently fast start-up of the transmitter, and on the other hand the cut-off frequency of the loop should be low enough so that the characteristics of the loop do not distort the signal to be modulated. The characteristics of the PLL synthesizer also depend on temperature, because of, for example, the centre frequency and the frequency/control voltage temperature dependence of the Voltage Controlled Oscillator (VCO) temperatures. The characteristics of FM modulation depend on the operating point in the synthesizer frequency band, i.e. on the transmission channel in which the signal is transmitted.

In digital modulation systems the implementation of an analog I/Q modulator presents high demands on the designers when the phasing needed in the modulator solution is realized so that the characteristics are adequate at different temperatures.

According to the present invention, there is provided a synthesizer for a radio transceiver, the radio transceiver comprising a receiver section for receiving a radio frequency signal and having a local oscillator for providing a local oscillator signal, and a mixer for generating a first intermediate frequency signal from the radio frequency signal and the local oscillator signal and a transmitter section for generating a modulated radio frequency signal for transmission therefrom, the transmitter section having means for generating a modulated signal at a second intermediate frequency signal, a local oscillator for generating a local oscillator signal and a mixer for generating the modulated radio frequency signal from the modulated intermediate frequency signal and the local oscillator signal, characterised in that the means for generating the modulated intermediate frequency signal comprises a direct digital synthesis system in which the modulated intermediate frequency signal is generated from a reference frequency.

This has the advantage that an integrated synthesizer is provided which can be used by the radio sections in different radiotelephone systems.

The advantages are also seen in a simplified design and production. The synthesizer in accordance with the invention also has the advantage that the frequencies can vary in accordance with the radiotelephone system where it is applied. The advantages are also seen for example in the size of the telephone designed for the digital radiotelephone system of the United States, since it is possible to realize parallel functions, e.g. FM and QPSK modulation, with the same components.

The synthesizer in accordance with the invention enables the use of Direct Digital Synthesis (DDS) in a radiotelephone without the need to notably sacrifice the other advantages obtained with direct digital synthesis.

The local oscillator frequency is also suitable as a reference due to its purity and accuracy, and the modulation and the desired center frequency are supplied as digital quantities in a controlled way.

A synthesizer in accordance with the invention makes it possible to have a short time for the transmitter to switch on and to switch to the channel, independent of the modulation requirements. Thus battery power can be saved, which is an essential factor in portable radiotelephones.

An embodiment of the invention will now be described, by way of example only, with reference to FIG. 1 which is a schematic block diagram of a synthesizer in accordance with the invention.

As is well known in the art, the radio section of a radio apparatus has a receiver section and a transmitter section.

The receiver section of a radio apparatus the received signal is combined with a local oscillator signal in a mixer and converted into an intermediate frequency (IF) signal at a lower fixed frequency which is then amplified and detected to reproduce the original information contained in the received signal. As this is also well known to a person skilled in the art, this will not be described in any greater detail herein.

In FIG. 1, the local oscillator for the mixer 8 in the receiver section is realized conventionally by a synthesizer 1 comprising a phase locked loop, the output signal Rx of which has a frequency which is locked, in a known manner, to a reference frequency supplied by a reference oscillator 2 coupled to the synthesizer 1. The reference frequency is generated for example by a temperature compensated crystal oscillator (TCXO). The TCXO can also be voltage controlled, i.e. a VCTCXO (Voltage Controlled Temperature Compensated Crystal Oscillator). Besides the temperature compensation the output frequency of the PLL can be locked by automatic frequency control e.g. to the input frequency of the received signal.

As well as being used in the receiver section as described, the output signal Rx is supplied to a DDS system (3).

A Direct Digital Synthesis (DDS) system is a system which provides a sine-wave which is generated digitally from a reference frequency using a Digital-to-Analog converter (DAC). A typical DDS system comprises a DDS micro-circuit, a DAC, a clock signal and a digital interface. The frequency resolution provided by a DDS is accurate, e.g. 0.007 Hz at a frequency of 30 MHz. The phase resolution of the signal is very accurate (0.00000008 degrees). The DDS system has a low power consumption and a small size. Therefore the DDS synthesizer is useful in applications which require rapid setting after a frequency or phase shift. Such applications include modes that can perform frequency hoppings, Phase Shift Keying (PSK) modes, tuneable transceivers, some broadband systems and signal generators. In telecommunication systems the DDS synthesizers can be used both as local oscillators and as modulators. It can also replace a VCO, in locking to a carrier wave, and in bit synchronization.

The output signal Tx of the transmitter section of the radio apparatus is generated by mixing, in a mixer 4, a shift oscillator signal, So, and the output signal Rx from the synthesizer 1. The shift oscillator signal, So, is generated in the DDS system 3 and contains modulation with the output signal Rx from the synthesizer 1. Between the output of the DDS system 3 and the mixer 4, a multiplier 5 can be provided to increase the frequency of the output from the DDS system 3 to be suitable for mixing. In addition it is possible to use filters 6 and 7 coupled between the DDS system 3 and the mixer 4 and after the mixer 4 respectively to remove redundant mixing results and spurious transmission.

The local oscillator i.e. synthesizer 1 is used to provide the reference frequency for the DDS system 3 and so enables the centre frequency of the DDS system to be controlled.

The reference frequency for the DDS system must be a multiple (at least double) of the output signal of the DDS system. Then it is a problem to generate the reference frequency in a radiotelephone, due to the high output frequency and temperature drift. On the other hand it is possible to generate the reference frequency with an extra oscillator, but this creates additional costs and will take up space.

It is possible to realize many different modulations with the DDS system 4, such as FM, QPSK and GMSK modulation, etc. The modulation and the desired center frequency are supplied to the DDS in digital form. These can have separate or common physical interfaces.

The local oscillator frequency is conventionally a multiple (2 ... 10 times) that of the shift oscillator frequency i.e. the output So, from the DDS system 3. If further a multiplier is used between the DDS system 3 and the mixer 4, the difference between the frequency of the DDS output So and the local oscillator frequency will be even bigger. Although the local oscillator frequency changes according to the channel, a correct transmitter frequency is maintained by correspondingly adjusting the DDS frequency.

If you try to cover transmitting and receiving channels only with the synthesizer generating the local oscillator signal, this leads to problems with phase errors and locking times. A part of the frequency band control can be handled by the DDS.

The arrangement can be used in both analog and digital systems and, as such, is particularly suited where the radio apparatus needs to be used in both analog and digital modes e.g. in the Tune Division Multiple Access (TDMA) system planned for the USA.

It will be evident, from the foregoing description, to a person skilled in the art, that various modifications are possible within the scope of the present invention.

I claim:

1. A synthesizer for a radio transceiver comprising:
   a local oscillator means for providing a local oscillator signal;
   a receiver section having a first mixer means coupled to said local oscillator means, for mixing a received radio frequency signal and said local oscillator signal and for generating an intermediate frequency signal; and
   a transmitter section comprising a direct digital synthesis means coupled to said local oscillator means for generating a modulated intermediate frequency signal, said local oscillator signal being employed by said direct digital synthesis means as a reference frequency signal, said transmitter section further comprising a second mixer means coupled to said local oscillator means for mixing said modulated intermediate frequency signal and said local oscillator signal and for generating a radio frequency transmission signal.

2. A synthesizer as recited in claim 1 wherein said direct digital synthesis means comprises a digital interface and a digital to analog converter, and is responsive to a frequency control digital value and a modulation input to produce said modulated intermediate frequency signal.

3. A synthesizer as recited in claim 1 wherein said transmitter section includes a multiplier circuit positioned between said direct digital synthesis means and said second mixer means for increasing a frequency of said modulated intermediate frequency signal.

4. A synthesizer according to claim 1 wherein said local oscillator means comprises a phase locked loop synthesizer that produces said local oscillator signal.

* * * * *